(12) United States Patent
Kim et al.

(10) Patent No.: US 9,013,379 B2
(45) Date of Patent: Apr. 21, 2015

(54) PULSE GENERATOR AND ORGANIC LIGHT EMITTING DISPLAY USING THE SAME

(75) Inventors: Do-Ik Kim, Yongin (KR); Joo-Hyeon Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 13/209,133

(22) Filed: Aug. 12, 2011

(65) Prior Publication Data

US 2012/0154259 A1 Jun. 21, 2012

(30) Foreign Application Priority Data

Dec. 20, 2010 (KR) ........................ 10-2010-0130683

(51) Int. Cl.
G09G 3/30 (2006.01)
H03K 5/12 (2006.01)
G09G 3/32 (2006.01)

(52) U.S. Cl.
CPC ................ *H03K 5/12* (2013.01); *G09G 3/3291* (2013.01)

(58) Field of Classification Search
USPC ..................................... 345/78, 211
See application file for complete search history.

(56) References Cited

U.S. PATENT DOCUMENTS

| | | | | |
|---|---|---|---|---|
| 5,517,207 A * | 5/1996 | Kawada et al. | ................. | 345/78 |
| 6,249,279 B1 * | 6/2001 | Shirasawa | ..................... | 345/211 |
| 6,633,287 B1 * | 10/2003 | Yatabe et al. | ................. | 345/211 |
| 2003/0085886 A1 * | 5/2003 | Ide et al. | ........................ | 345/211 |
| 2004/0145411 A1 * | 7/2004 | Harvey | ......................... | 330/251 |
| 2005/0057468 A1 * | 3/2005 | Yamamoto et al. | ............. | 345/87 |
| 2006/0092185 A1 * | 5/2006 | Jo et al. | ........................... | 345/690 |
| 2006/0125740 A1 * | 6/2006 | Shirasaki et al. | ............... | 345/77 |
| 2007/0018939 A1 * | 1/2007 | Chen et al. | .................... | 345/100 |
| 2008/0174287 A1 * | 7/2008 | Park | ................................ | 323/271 |
| 2009/0002356 A1 * | 1/2009 | Sumioka et al. | .............. | 345/211 |
| 2009/0218937 A1 * | 9/2009 | Lee | ................................ | 313/504 |
| 2010/0033472 A1 * | 2/2010 | Choi | ............................. | 345/213 |
| 2010/0073346 A1 * | 3/2010 | Min et al. | ...................... | 345/211 |
| 2012/0007848 A1 * | 1/2012 | Han et al. | ...................... | 345/212 |
| 2012/0019505 A1 * | 1/2012 | Hwang | ........................... | 345/212 |
| 2012/0038607 A1 * | 2/2012 | Kang et al. | .................... | 345/211 |
| 2012/0044273 A1 * | 2/2012 | Park et al. | ..................... | 345/690 |
| 2012/0139890 A1 * | 6/2012 | Choi | ............................. | 345/212 |

FOREIGN PATENT DOCUMENTS

KR 10-2005-0115008 A 12/2005
KR 10-2008-0107906 A 12/2008

* cited by examiner

*Primary Examiner* — Claire X Pappas
*Assistant Examiner* — Robert Stone
(74) *Attorney, Agent, or Firm* — Christie, Parker & Hale, LLP

(57) ABSTRACT

A pulse generator that is capable of improving (e.g., increasing) the rising and falling speeds of its pulses. The pulse generator includes a third switch and a first diode serially coupled between a first power source and a data line; a fourth switch and a second diode serially coupled between the data line and a second power source configured to have a voltage lower than that of the first power source; a pulse controller for increasing a voltage of the data line to a voltage higher than that of the first power source or for reducing the voltage of the data line to a voltage lower than that of the second power source; and a first capacitor coupled between the pulse controller and the data line.

6 Claims, 3 Drawing Sheets

PULSE GENERATOR AND ORGANIC LIGHT EMITTING DISPLAY USING THE SAME

CROSS-REFERENCE TO RELATED APPLICATION

This application claims priority to and the benefit of Korean Patent Application No. 10-2010-0130683, filed on Dec. 20, 2010, in the Korean Intellectual Property Office, the entire content of which is incorporated herein by reference.

BACKGROUND

1. Field

The following description relates to a pulse generator and an organic light emitting display using the same, and more particularly, to a pulse generator that can increase its pulse rising and falling speeds and an organic light emitting display using the same.

2. Description of the Related Art

Recently, various flat panel displays (FPDs) that are light in weight and smaller in volume than comparable cathode ray tubes (CRT) have been developed. The FPDs include liquid crystal displays (LCD), field emission displays (FED), plasma display panels (PDP), and organic light emitting displays.

Among the FPDs, the organic light emitting displays display images using organic light emitting diodes (OLED) that generate light by re-combination of electrons and holes. The organic light emitting display has high response speed and is driven with low power consumption.

In general, flat panel displays (FPDs) can be driven by an analog method or a digital method. Gray scales are realized using a voltage difference in the analog driving method and are realized using a time difference in the digital driving method. That is, in the analog driving method, different voltages are applied to pixels to realize the gray scales. By contrast, in the digital driving method, the same voltage (pulse) is applied to each of the pixels but the display times of the pixels are controlled to realize gray scales.

SUMMARY

Aspects of embodiments of the present invention are directed toward a pulse generator capable of increasing its pulse rising speed and falling speed and an organic light emitting display using the same.

In an embodiment of the present invention, there is provided a pulse generator, including a third switch and a first diode serially coupled between a first power source and a data line, a fourth switch and a second diode serially coupled between the data line and a second power source configured to have a voltage lower than that of the first power source, a pulse controller for increasing the voltage of the data line to a voltage higher than that of the first power source or for reducing the voltage of the data line to a voltage lower than that of the second power source, and a first capacitor coupled between the pulse controller and the data line.

In one embodiment, the pulse controller includes a first switch coupled between the first capacitor and a third power source configured to have a voltage higher than that of the first power source and a second switch coupled between the first capacitor and a fourth power source configured to have a voltage lower than that of the second power source. In one embodiment, the first switch and the third switch are configured to be currently turned on and off. In one embodiment, the second switch and the fourth switch are configured to be currently turned on and off. In one embodiment, the first switch and the second switch are configured to be alternately turned on and off. In one embodiment, the third switch and the fourth switch are configured to be alternately turned on and off. In one embodiment, the first diode is configured to flow current from the third switch to the data line. In one embodiment, the second diode is configured to flow current from the data line to the fourth switch.

In another embodiment of the present invention, there is provided an organic light emitting display, including a first pulse generator for outputting a high voltage of a first power source or a low voltage of a second power source; a second pulse generator for outputting the low voltage of the second power source when the high voltage of the first power source is output from the first pulse generator, and for outputting the high voltage of the first power source when the low voltage of the second power source is output from the first pulse generator; pixels positioned at crossings of scan lines and data lines; a scan driver for driving the scan lines; a switching unit formed with each of the data lines to be coupled to the first pulse generator and the second pulse generator; and a data driver for controlling the switching units to be coupled to the first pulse generator or the second pulse generator in accordance with data.

In one embodiment, each of the switching units includes: a tenth switch coupled between a data line and the first pulse generator; and an eleventh switch coupled between the data line and the second pulse generator. In one embodiment, each of the pulse generators includes: a third switch and a third diode serially coupled between a first power source and a data line; a fourth switch and a second diode serially coupled between the data line and a second power source configured to have a voltage lower than that of the first power source; a first switch coupled between a first node and a third power source configured to have a voltage higher than that of the first power source; a second switch coupled between the first node and a fourth power source configured to have a voltage lower than that of the second power source; and a first capacitor coupled between the first node and the data line. In one embodiment, the first switch and the third switch are configured to be alternately turned on and off with the second switch and the fourth switch. In one embodiment, the first diode is configured to flow current from the third switch to the data line. In one embodiment, the second diode is configured to flow current from the data line to the fourth switch.

In the pulse generator and the organic light emitting display using the same, according to embodiments of the present invention, when the pulses are supplied to the data lines, the voltage is increased to a higher voltage than the desired voltage or is reduced to a lower voltage than the desired voltage. Then, the rising and falling speeds of the pulses are increased so that the desired voltage may be supplied regardless of the position of a pixel.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
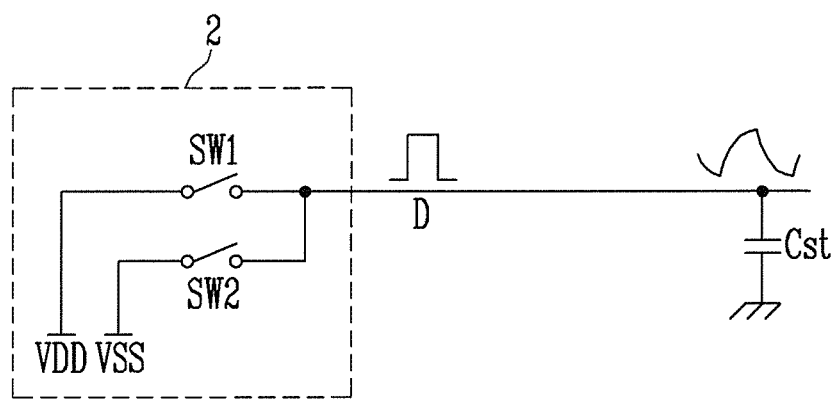
FIG. 1 is a view illustrating a comparable pulse generator.

Hereinafter, certain exemplary embodiments according to the present invention will be described with reference to the accompanying drawings. Here, when a first element is described as being coupled to a second element, the first element may be not only directly coupled to the second element, but may also be indirectly coupled to the second element via one or more third elements therebetween. Further, some of the elements that are not essential to the complete understanding of the invention are omitted for clarity. Also, like reference numerals refer to like elements throughout.

As discussed above, flat panel displays (FPDs) can be driven by an analog method or a digital method. Gray scales are realized using a voltage difference in the analog driving method and are realized using a time difference in the digital driving method. That is, in the analog driving method, different voltages are applied to pixels to realize the gray scales. By contrast, in the digital driving method, the same voltage (pulse) is applied to each of the pixels but the display times of the pixels are controlled to realize gray scales.

FIG. 1 is a view illustrating a comparable pulse generator used for a digital driving method.

Referring to FIG. 1, the conventional pulse generator 2 includes a first power source VDD and a second power source VSS, a first switch SW1 coupled between the first power source VDD and a data line D, and a second switch SW2 coupled between the second power source VSS and the data line D.

The first switch SW1 and the second switch SW2 are alternately turned on to generate a square wave pulse. Therefore, the first power source VDD is set to have a voltage higher than the second power source VSS. Here, the first power source VDD is set to have a voltage at which transistors included in a pixel may be turned off (or turned on), and the second power source VSS is set to have a voltage by which the transistors included in the pixel may be turned on (or turned off). The pixel realizes the gray scales while being turned on or off for a set or predetermined time to correspond to the voltage (VDD or VSS) supplied from the pulse generator 2.

However, in the comparable pulse generator 2, the rising speed and the falling speed (of the pulse generated by the pulse generator 2) are both delayed by the storage capacitors Cst included in pixels coupled to the resistance of the data line D, the parasitic capacitor (capacitance) of the data line D, and data lines. Actually, a desired voltage is not supplied to the pixel positioned at the end of the data line D due to the delay of the rising speed and the falling speed.

Hereinafter, exemplary embodiments of the present invention, by which those who skilled in the art may easily perform the present invention, will be described in detail with reference to FIGS. 2 to 4.

Figure 2:
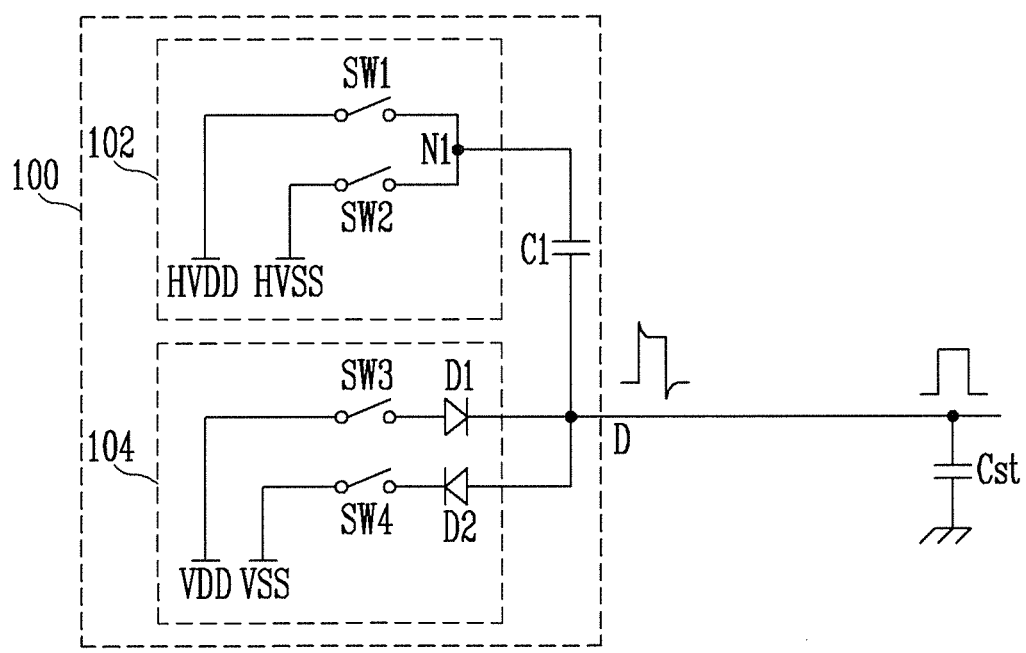
FIG. 2 is a view illustrating a pulse generator according to an embodiment of the present invention.

FIG. 2 is a view illustrating a pulse generator according to an embodiment of the present invention.

Referring to FIG. 2, the pulse generator 100 includes a pulse controller 102, a pulse maintaining unit 104, and a capacitor C1.

The pulse controller 102 supplies a set or predetermined voltage when a pulse rises and falls. Actually, the pulse controller 102 supplies a third power source HVDD higher than a first power source VDD when the pulse rises and supplies a fourth power source HVSS lower than a second power source VSS when the pulse falls.

Therefore, the pulse controller 102 includes: a first switch SW1 coupled between the third power source HVDD and a first node N1; and a second switch SW2 coupled between the fourth power source HVSS and the first node N1. The first switch SW1 and the second switch SW2 are alternately turned on and off to control the voltage applied to the first node N1.

The pulse maintaining unit 104 supplies the sustaining voltage of a pulse, that is, the voltage of the first power source VDD or the second power source VSS. Therefore, the pulse sustaining unit 104 includes: a third switch SW3 and a first diode D1 serially coupled between the first power source VDD and a data line D; and a fourth switch SW4 and a second diode D2 serially coupled between the second power source VSS and the data line D.

The third switch SW3 is simultaneously (or concurrently) turned on and off with the first switch SW1 to control the voltage supplied to the data line D. The first diode D1 is provided so that current flows from the third switch SW3 to the data line D.

A fourth switch SW4 is simultaneously (or concurrently) turned on and off with a second switch SW2 to control the voltage supplied to the data line D. The second diode D2 is provided so that current flows from the data line D to the fourth switch SW4.

Figure 3:
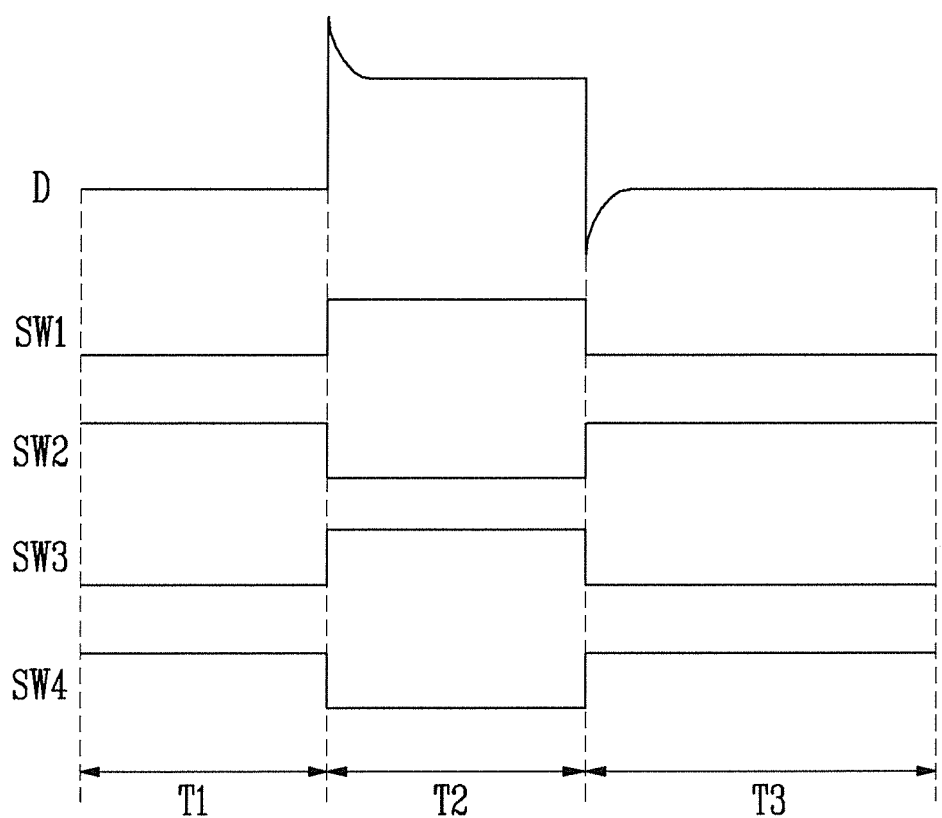
FIG. 3 is a waveform chart illustrating the operation processes of the pulse generator illustrated in FIG. 2.

FIG. 3 is a waveform chart illustrating the driving operations of the pulse generator of FIG. 2.

Referring to FIG. 3, first, in a first period T1, the second switch SW2 and the fourth switch SW4 are set to be turned on. When the second switch SW2 and the fourth switch SW4 are turned on, a low voltage (that is, the voltage of the second power source VSS) is supplied to the data line D.

Then, in a second period T2, the first switch SW1 and the third switch SW3 are turned on and the second switch SW2 and the fourth switch SW4 are turned off. When the first switch SW1 is turned on, the voltage of the third power source HVDD is supplied to the first node N1. When the third power source HVDD is supplied to the first node N1, the voltage of the data line D rises to a higher voltage than the first power source VDD.

In more detail, in the first period T1, the voltage (for example, 1V) corresponding to a difference between the second power source VSS (for example, 0V) and a fourth power source HVSS (for example, −1V) is charged in the first capacitor C1. The voltage charged in the first capacitor C1 is set as a voltage higher in the data line D than in the first node N1. Then, when the first switch SW1 is turned on in the second period T2, the voltage of the first node N1 rises to the voltage of the third power source HVDD (for example, 10V). Then, the voltage of the data line D is added to the voltage charged in the first capacitor C1 and is increased to a higher voltage (for example, about 11V) than the voltage of the first power source VDD (for example, 9V).

On the other hand, when the third switch SW3 is turned on, the voltage of the first power source VDD is supplied to the anode of the first diode D1. At this time, since a higher voltage than the voltage of the first power source VDD is applied to the data line D, the first diode D1 is set to be turned off.

At this time, the voltage of the data line D charges the parasitic capacitor (capacitance) of the data line D and is gradually reduced. When the voltage of the data line D is lower than the voltage of the first power source VDD, the first diode D1 is turned on so that the voltage of the data line D is maintained at the voltage of the first power source VDD. That is, in the second period T2, the voltage of the data line D is initially and instantaneously increased to a higher voltage than the voltage of the first power source VDD and then reduced to the voltage of the first power source VDD. Then, in the remaining second period T2 where the first switch SW1 and the third switch SW3 maintain a turn on state, the data line D stably maintains the voltage of the first power source VDD.

In a third period T3, the second switch SW2 and the fourth switch SW4 are turned on and the first switch SW1 and the third switch SW3 are turned off. When the second switch SW2 is turned on, the voltage of the fourth power source HVSS is supplied to the first node N1. When the voltage of the fourth power source HVSS is supplied to the first node N1, the voltage of the data line D is reduced to a lower voltage than the voltage of the second power source VSS.

In detail, in the second period T2, the voltage (for example, 1V) corresponding to a difference between the first power source VDD and the third power source HVDD is charged in the first capacitor C1. The voltage charged in the first capacitor C1 is set as a voltage higher in the first node N1 than in the data line D. Then, in the third period T3, when the second switch SW2 is turned on, the voltage of the first node N1 is reduced to the voltage of the fourth power source HVSS. Then, the voltage of the data line D is added to the voltage charged in the first capacitor C1 to be reduced to a lower voltage (for example, about −2V) than the voltage of the second power source VSS.

On the other hand, when the fourth switch SW4 is turned on, the voltage of the second power source VSS is supplied to the cathode of the second diode D2. At this time, since the lower voltage than the second power source VSS is applied to a data line D1, the second diode D2 is set to be turned off.

Then, the voltage of the data line D gradually rises from the parasitic capacitor of the data line D by a discharged voltage. When the voltage of the data line D is higher than the voltage of the second power source VSS, the second diode D2 is turned on so that the voltage of the data line D is maintained at the voltage of the second power source VSS. That is, in the third period T3, the voltage of the data line D is initially and instantaneously reduced to the lower voltage than the second power source VSS and then increased to the voltage of the second power source VSS. In the remaining third period T3 where the second switch SW2 and the fourth switch SW4 maintain a turn on state, the data line D stably maintains the voltage of the second power source VSS.

As described above, according to an embodiment of the present invention, when the pulse generator 102 supplies a square wave pulse, a higher voltage than a desired voltage is applied in a rising period and a lower voltage than the desired voltage is applied in a falling period. Then, the rising speed and the falling speed of the pulse increase so that the desired voltage may be quickly supplied to the pixel positioned at the end of the data line D.

Additionally, the pulse generator 102 according to an embodiment of the present invention is provided in each channel of a data driver to supply a low voltage VSS or a high voltage VDD to correspond to data. In addition, according to an embodiment of the present invention, two pulse generators 102 are shared to supply the low voltage VSS or the high voltage VDD to data lines.

Figure 4:
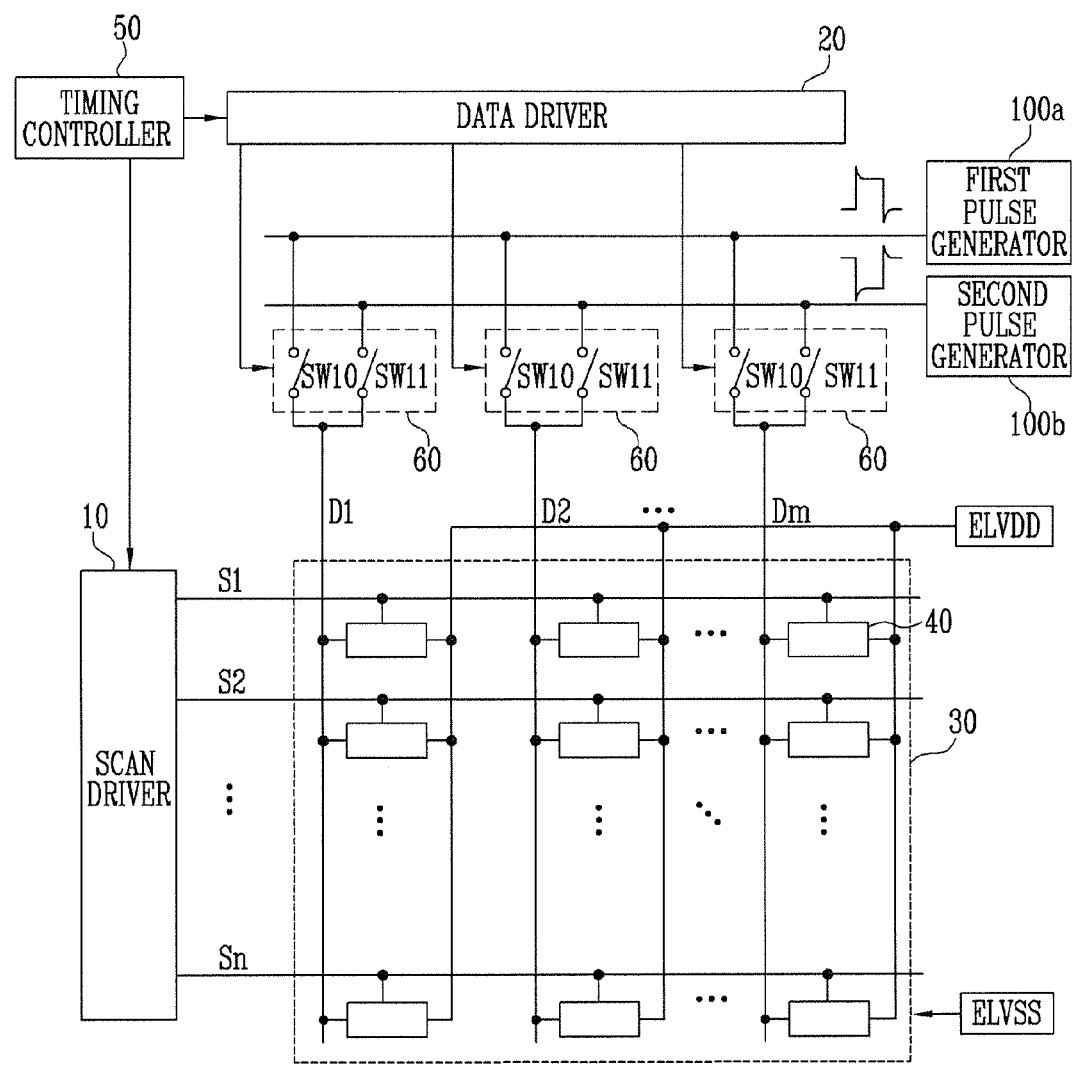
FIG. 4 is a view illustrating an organic light emitting display according to an embodiment of the present invention.

FIG. 4 is a view illustrating an organic light emitting display according to an embodiment of the present invention.

Referring to FIG. 4, the organic light emitting display includes pixels 40 positioned at the intersections (or crossings) of scan lines S1 to Sn and data lines D1 to Dm, a scan driver 10 for driving scan lines S1 to Sn, a data driver 20 for driving data lines D1 to Dm, a timing controller 50 for controlling the scan driver 10 and the data driver 20, switching units 60 coupled to the data lines D1 to Dm, and a first pulse generator 100a and a second pulse generator 100b commonly coupled to the switching units 60.

A pixel unit 30 supplies the power (e.g., a high voltage) of first power source ELVDD and the power (e.g., a low voltage) of the second power source ELVSS received from the outside to the pixels 40. The pixels 40 that receive the power (e.g., the high voltage) of the first power source ELVDD and the power (e.g., the low voltage) of the second power source ELVSS receive data signals to correspond to scan signals and either emit light or do not emit light to correspond to the received data signals.

The scan driver 10 sequentially supplies the scan signals to the scan lines S1 to Sn in the scan periods of a plurality of sub frames included in one frame. When the scan signals are sequentially supplied to the scan lines S1 to Sn, the pixels 40 are sequentially selected in units of lines and the data signals are supplied to the selected pixels 40.

The data driver 20 supplies the data signals to the data lines D1 to Dm in synchronization with the scan signals in the scan periods of the sub frames. Therefore, the data driver 20 controls the switching units 60 so that a low or high voltage may be supplied to the data lines D1 to Dm to correspond to data.

The timing controller 50 controls the scan driver 10 and the data driver 20.

A first pulse generator 100a and a second pulse generator 100b are commonly coupled to the switching units 60. The first pulse generator 100a and the second pulse generator 100b supply different voltages to the switching units 60. For example, the first pulse generator 100a supplies a high voltage (or a low voltage) to the switching units 60, and the second pulse generator 100b supplies a low voltage (or a high voltage) to the switching units 60. On the other hand, since the structures of the pulse generators 100a and 100b are the same as illustrated in FIG. 2, detailed description thereof will be omitted.

Each of the switching units 60 includes a tenth switch SW10 coupled between one of the data lines D1 to Dm and the first pulse generator 100a and an eleventh switch SW11 coupled between one of the data lines D1 to Dm and the second pulse generator 100b.

The tenth switch SW10 and the eleventh switch SW11 are alternately turned on by the control of the data driver 20 to supply a voltage from the first pulse generator 100a or the second pulse generator 100b as a data signal to one of the data lines D1 to Dm.

In operation, the scan signals are sequentially supplied to the scan lines S1 to Sn in the scan periods of the sub frames. The data driver 20 controls the switching units 60 in synchronization with the scan signals. For example, the data driver 20 turns on the tenth switch SW10 of the switching unit 60 coupled to a first data line D1 so that a high voltage is supplied to the data line coupled to the first data line D1 and turns on the eleventh switch SW11 of the switching unit 60 coupled to a second data line D2 so that a low voltage is supplied to the data line coupled to the second data line D2.

That is, the data driver 20 supplies the data signal of the high or low voltage to the data lines D1 to Dm while controlling the turning on of the tenth switch SW10 and the eleventh switch SW11 included in the switching units 60. The pixels 40 realize set or predetermined gray scales while being set in an emission state or a non-emission state in a predetermined time (sub frames) to correspond to the data signals supplied thereto.

On the other hand, in FIG. 4, for convenience sake, the data driver 20, the switching units 60, and the pulse generators 100a and 110b are separated from each other. However, the present invention is not limited to the above. For example, the switching units 60 and/or the pulse generators 100*a* and 100*b* may be inserted into the data driver 20 in the form of an integrated circuit.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display, comprising:
   a first pulse generator for outputting a high voltage of a first power source or a low voltage of a second power source to a first data line;
   a second pulse generator separate from the first pulse generator for outputting the low voltage of the second power source to a second data line when the high voltage of the first power source is output to the first data line from the first pulse generator and for outputting the high voltage of the first power source to the second data line when the low voltage of the second power source is output from the first pulse generator to the first data line;
   pixels positioned at crossings of scan lines and data lines;
   a scan driver for driving the scan lines;
   a switching unit formed with each of the data lines to be coupled to the first pulse generator and the second pulse generator; and
   a data driver for controlling the switching units to be coupled to the first pulse generator or the second pulse generator in accordance with data.

2. The organic light emitting display as claimed in claim 1, wherein each of the switching units comprises:
   a tenth switch coupled between a data line of the data lines and the first pulse generator; and
   an eleventh switch coupled between the data line and the second pulse generator.

3. The organic light emitting display as claimed in claim 1, wherein each of the pulse generators comprises:
   a third switch and a first diode serially coupled between the first power source and a data line of the data lines;
   a fourth switch and a second diode serially coupled between the data line and the second power source configured to have a voltage lower than that of the first power source;
   a first switch coupled between a first node and a third power source configured to have a voltage higher than that of the first power source;
   a second switch coupled between the first node and a fourth power source configured to have a voltage lower than that of the second power source; and
   a first capacitor coupled between the first node and the data line.

4. The organic light emitting display as claimed in claim 3, wherein the first switch and the third switch are configured to be alternately turned on and off with the second switch and the fourth switch.

5. The organic light emitting display as claimed in claim 3, wherein the first diode is configured to flow current from the third switch to the data line.

6. The organic light emitting display as claimed in claim 3, wherein the second diode is configured to flow current from the data line to the fourth switch.

* * * * *